United States Patent
Liang et al.

(10) Patent No.: US 10,490,501 B2
(45) Date of Patent: Nov. 26, 2019

(54) METHOD TO FORM INTERCONNECT STRUCTURE WITH TUNGSTEN FILL

(71) Applicant: GLOBALFOUNDRIES INC., Grand Cayman (KY)

(72) Inventors: Jim Shih-Chun Liang, Poughkeepsie, NY (US); Keith Kwong Hon Wong, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 53 days.

(21) Appl. No.: 15/893,193

(22) Filed: Feb. 9, 2018

(65) Prior Publication Data
US 2018/0166385 A1    Jun. 14, 2018

Related U.S. Application Data

(62) Division of application No. 15/351,750, filed on Nov. 15, 2016, now abandoned.

(51) Int. Cl.
*H01L 23/528* (2006.01)
*H01L 23/532* (2006.01)
(Continued)

(52) U.S. Cl.
CPC .... *H01L 23/5283* (2013.01); *H01L 21/76846* (2013.01); *H01L 21/76855* (2013.01);
(Continued)

(58) Field of Classification Search
CPC ......... H01L 21/76877; H01L 21/76843; H01L 23/53238; H01L 21/76849; H01L 23/5226;
(Continued)

(56) References Cited

U.S. PATENT DOCUMENTS 9,287,170 B2    3/2016 Lee et al.
2001/0033023 A1* 10/2001 Suguro ............. H01L 21/31683
257/751
(Continued)

FOREIGN PATENT DOCUMENTS

WO    2015048221 A1    4/2015

OTHER PUBLICATIONS

Anonymous, "Electrode Potential and Galvanic Corrosion", retrieved from http://www.engineeringtoolbox.com/electrode-potential-d_482.html on Jul. 7, 2017, 1 page.

*Primary Examiner* — David Chen
(74) *Attorney, Agent, or Firm* — Anthony Canale; Hoffman Warnick LLC

(57) ABSTRACT

Aspects of the present disclosure include a method for forming a contact on a semiconductor device, the semiconductor device including a conductive region disposed over a substrate, the method comprising: depositing a dielectric material on the substrate; forming an opening in the dielectric material to expose the conductive region; forming a barrier layer on a lower surface and sidewalls of the opening in the dielectric material, the barrier layer terminating below an upper surface of the dielectric material and surrounding a lower portion of the opening; depositing cobalt in the lower portion of the opening, the cobalt terminating at an upper surface of the barrier layer; depositing tungsten to fill the opening to at least the upper surface of the dielectric material; and planarizing the upper surface of the dielectric material with the tungsten in the opening.

11 Claims, 15 Drawing Sheets

(51) Int. Cl.
*H01L 21/768* (2006.01)
*H01L 29/49* (2006.01)
*H01L 23/522* (2006.01)

(52) U.S. Cl.
CPC .. *H01L 21/76877* (2013.01); *H01L 21/76879* (2013.01); *H01L 21/76889* (2013.01); *H01L 23/53266* (2013.01); *H01L 23/53295* (2013.01); H01L 23/5226 (2013.01); H01L 29/4966 (2013.01)

(58) Field of Classification Search
CPC .......... H01L 29/4966; H01L 23/53266; H01L 21/76846
USPC ....... 438/627, 629, 637, 643, 648, 653, 672, 438/675
See application file for complete search history.

(56) References Cited

U.S. PATENT DOCUMENTS

| | | |
|---|---|---|
| 2002/0019127 A1 | 2/2002 | Givens |
| 2005/0032365 A1 | 2/2005 | Marsh |
| 2005/0082676 A1* | 4/2005 | Andry ............... H01L 21/76898 257/763 |
| 2011/0049716 A1 | 3/2011 | Yang et al. |
| 2014/0183738 A1 | 7/2014 | Jezewski et al. |
| 2014/0264920 A1 | 9/2014 | Yang et al. |
| 2015/0108577 A1* | 4/2015 | Cai ................... H01L 21/28008 257/369 |
| 2015/0126023 A1* | 5/2015 | Choi ................. H01L 21/28158 438/591 |
| 2015/0179662 A1* | 6/2015 | Makala ............ H01L 27/11578 257/314 |
| 2016/0163587 A1 | 6/2016 | Backes et al. |
| 2017/0194459 A1* | 7/2017 | Ando ............... H01L 29/66545 |

* cited by examiner

METHOD TO FORM INTERCONNECT STRUCTURE WITH TUNGSTEN FILL

TECHNICAL FIELD

The present application relates to methods of forming a semiconductor structure. More particularly, the present application relates to methods of forming an interconnect structure having improved reliability and structures related to the methods discussed herein.

BACKGROUND

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include transistors, resistors, capacitors, and the like, with intermediate and overlying metallization patterns at varying levels, separated by dielectric materials, which interconnect the semiconductor devices to form integrated circuits.

Field-effect transistors (FETs), such as metal-oxide-semiconductor FETs (MOSFETs), are a commonly used semiconductor device. Generally, a FET has three terminals, i.e., a gate structure (or gate stack), a source region, and a drain region. In some instances, the body of the semiconductor may be considered a fourth terminal. The gate stack is a structure used to control output current, i.e., flow of carriers in the channel portion of a FET, through electrical or magnetic fields. The channel portion of the substrate is the region between the source region and the drain region of a semiconductor device that becomes conductive when the semiconductor device is turned on. The source region is a doped region in the semiconductor device from which majority carriers are flowing into the channel portion. The drain region is a doped region in the semiconductor device located at the end of the channel portion, in which carriers are flowing into from the source region via the channel portion and out of the semiconductor device through the drain region. A conductive plug, or contact, is electrically coupled to each terminal. One contact is made to the source region, one contact is made to the drain region, and one contact is made to the gate stack.

Metallic tungsten (W) is the primary conductor for contacts. As semiconductor nodes are scaled down, the transistors and contacts become increasingly smaller. Tungsten (W) has been shown to form a highly resistive beta phase at trench dimensions of less than 15 nanometers (nm). This property of W creates a problem for advanced nodes including 7 nm and 10 nm nodes.

SUMMARY

A first embodiment of the present disclosure provides a method for forming a contact on a semiconductor device wherein the semiconductor device includes a conductive region disposed over a substrate. The method includes depositing a dielectric material on the substrate and forming an opening in the dielectric material to expose the conductive region. The opening has an upper opening and a lower opening. The lower opening has sidewalls and a barrier layer deposited thereon. The barrier layer terminates below an upper surface of the dielectric material and the barrier layer surrounds the lower opening. The method includes depositing cobalt in the lower opening, the cobalt terminates at an upper surface of the barrier layer. The method includes depositing tungsten to fill the upper opening to at least the upper surface of the dielectric material. The method includes planarizing the upper surface of the dielectric material with the tungsten in the opening.

A second embodiment of the present disclosure provides a method for forming a contact on a semiconductor device wherein the semiconductor device includes a conductive region disposed on a substrate. The method includes depositing a dielectric material on the substrate and forming a first opening in the dielectric material to expose a conductive region wherein the first opening has sidewalls. A barrier layer is deposited on the sidewalls and the exposed conductive region of the first opening. The method includes depositing a fluorine free tungsten layer on the barrier layer. The method includes depositing a spacer material in the opening having the barrier layer. The method includes ashing a portion of the spacer material to form a second opening that extends to the upper surface of the unashed portion of the spacer material. The barrier layer in the second opening is removed to expose the sidewalls above the unashed spacer layer. The method includes ashing the unashed portion of the spacer material to extend the second opening to the barrier layer on the conductive region. Cobalt is deposited in the extended second opening wherein the cobalt terminates below an upper surface of the dielectric layer. Tungsten is deposited to fill the second opening and an upper surface of the dielectric material is planarized. The cobalt plug is completely encased in tungsten.

A third embodiment of the present disclosure provides a semiconductor device which includes a dielectric layer deposited over a conductive region and an interconnect electrically connecting the conductive region with a top surface of the dielectric layer. The interconnect includes a barrier layer extending from an interior of the dielectric layer to the conductive region and covering the conductive region. The barrier layer encases a cobalt plug. The interconnect includes a tungsten cap on an upper surface of the cobalt plug. The tungsten cap is coplanar with an upper surface of the dielectric layer. In this embodiment, the barrier layer includes Ti and fluorine free tungsten. As a result, the cobalt plug is once again encased in tungsten like the previous embodiment.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

Resistance of contacts in integrated circuits (ICs) has become an issue as IC's have become smaller. Because tungsten forms a highly resistive beta phase at small feature sizes, advanced nodes can have unacceptable resistances when using tungsten contacts. Cobalt (Co) does not form a resistive phase at sizes used in advanced nodes and can be used for contacts. However, cobalt presents challenges. Cobalt corrodes during chemical mechanical polishing. Cobalt is subject to oxidation. Cobalt diffuses during post annealing and cobalt is subject to electro-migration.

FIGS. 1, 10, 12 and 14 depict exemplary semiconductor devices having a cobalt contact. Although the present disclosure provides details concerning forming the contact structures to the source region and the drain regions of field effect transistor (FET) (the exemplary semiconductor device), the process disclosed herein may provide electrical contact to any conductive region of any device including, but not limited to, memory devices, resistors, diodes, capacitors, and other semiconductor devices, such as finFETs, Schottky barrier MOSFETS, and bipolar junction transistors.

Figure 1:
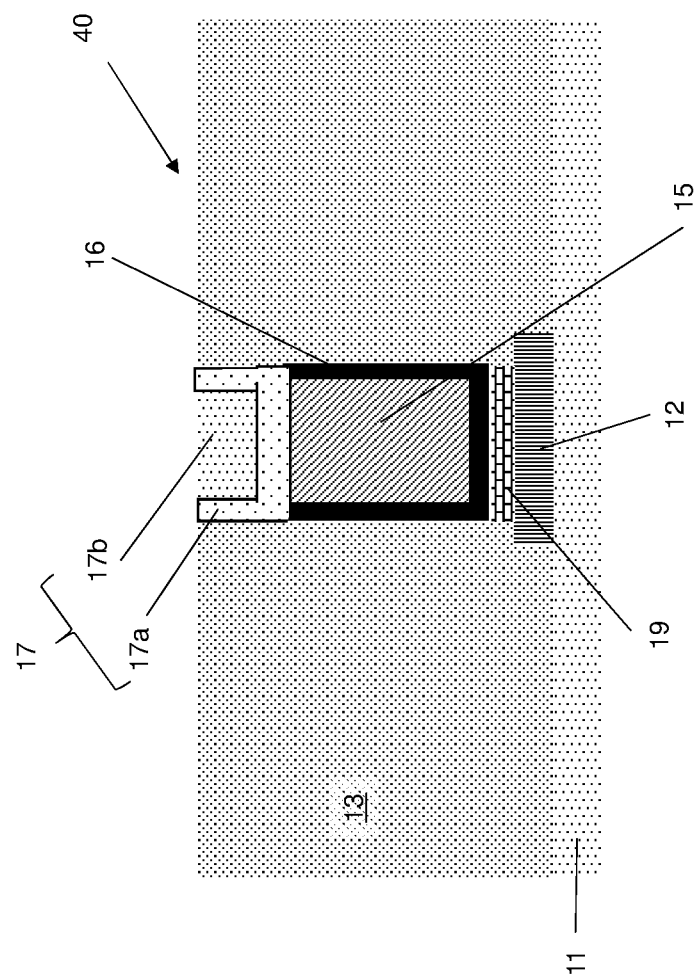
FIG. 1 illustrates a cross-sectional view of an embodiment of a conductive contact for a semiconductor device.

FIG. 1 shows a semiconductor device 10 having a substrate layer 11 and conductive region 12 over substrate layer 11. A dielectric layer 13 is deposited on substrate layer 11 and conductive region 12. The conductive region can be a source or drain region in a FET. A cobalt plug 15 is electrically coupled to conductive region 12. In an embodiment shown in FIG. 1, cobalt plug 15 is surrounded by titanium nitride layers 16. At the surface of conductive region 12 there is a titanium liner 19. In finFETs and other devices, titanium liner 19 is used to form a low resistive contact to conductive region 12. Above cobalt contact 15 is a tungsten cap 17. Tungsten 17 cap is formed in a two stage process, the first step being deposition of tungsten layer 17a followed by deposition tungsten 17b.

Substrate layer 11 may be any semiconductor such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs). Substrate layer is may be a fin in a fin-type Field Effect Transistor (finFET).

Conductive region 12 (e.g. source or drain region) can be silicon, silicide or silicon that is silicidized. In FIG. 1, the conductive region 12 is silicidized with titanium which also leaves a thin layer of titanium on the surface of the conductive region. The conductivity-type of conductive region 12 determines the conductivity of FET. Conductivity-type denotes whether conductive region 12 has been doped with a p-type or n-type dopant. N-type dopant in a silicon containing material includes type V elements from the Periodic Table of Elements, such as phosphorus and arsenic. P-type dopant in a silicon containing material includes type III elements from the Periodic Table of Elements, such as boron.

Conductive region 12 may include an extension dopant region (not shown) and a deep dopant region. The deep dopant region is usually formed either through implantation or epitaxial growth wherein the source and drain regions are doped in situ during formation.

Dielectric materials of layer 13 may include any interlevel or intralevel dielectric material including inorganic dielectric materials, organic dielectric materials, or combinations thereof. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Dielectric materials may be porous, non-porous or contain regions and/or surfaces that are porous and other regions and/or surfaces that may be non-porous. Some examples of suitable dielectrics that can be used may include, but are not limited to, silicon oxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present disclosure, dielectric materials have a dielectric constant that is about 3.0 or less, with a dielectric constant of about 2.8 or less being even more typical. As used herein, "about" or "approximately" indicate +/−10% of the value(s) stated. All dielectric constants mentioned herein are relative to a vacuum, unless otherwise noted. Dielectric materials that have dielectric constants of about 3.0 or less generally have a lower parasitic cross talk as compared with dielectric materials that have a higher dielectric constant than 4.0.

Figure 2:
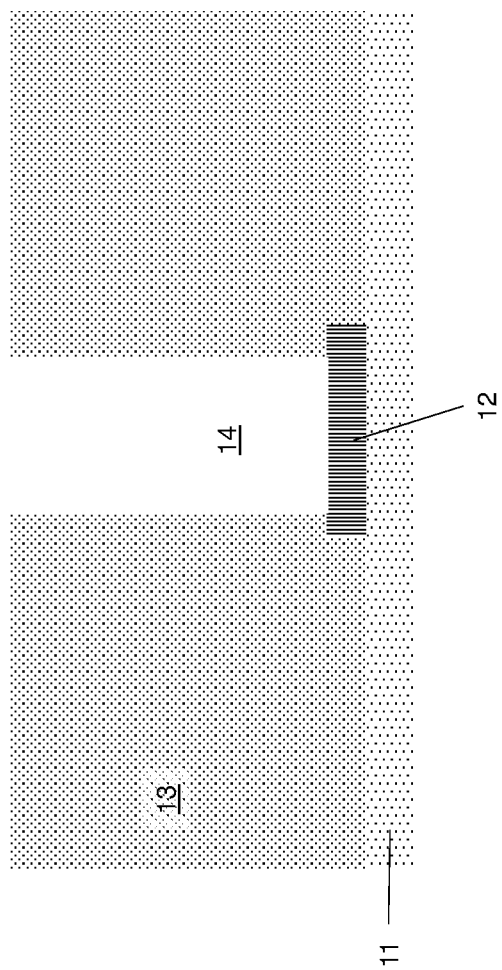
FIG. 2 illustrates a cross-sectional view of embodiments of a method for forming the conductive contact for a semiconductor shown in FIG. 1.

Referring to FIGS. 2-9 cross-sectional views of a method of manufacturing of the embodiment of FIG. 1 is described. FIG. 2 shows a substrate layer 11 and conductive region 12 over substrate layer 11. A dielectric layer 13 is over substrate layer 11 and conductive region 12. An opening 14 or contact hole is etched to expose conductive region 12.

Opening 14 may be formed as substantially cylindrical opening or as a trench with an elongated dimension. In FIG. 2, opening 14 is shown by way of a non-limiting example. Opening 14 may be formed through lithographically patterning and etching. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example, etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma.

Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features.

A pre-clean process or cleaning process can be performed prior to the formation of opening 14, after the formation of opening 14 or both. The pre-clean process or cleaning process is intended to remove contaminants. The pre-clean process can include one or more of the following process steps: 1. A plasma treatment using hydrogen gas ($H_2$), in which the active species might include H (atomic hydrogen) or H+ (hydrogen ions). The hydrogen may be diluted by a carrier gas such as He, Ar, $N_2$, etc. 2. A thermal treatment with $H_2$ for thermal reduction of native oxides. 3. A sputter-etch process involving an noble gas ions such as Ar+, He+, Ne+ for physical sputtering of interfacial contaminants and native oxides.

In embodiments, the pre-clean process may be performed using a hydrogen fluoride (HF) based wet clean process.

Figure 3:
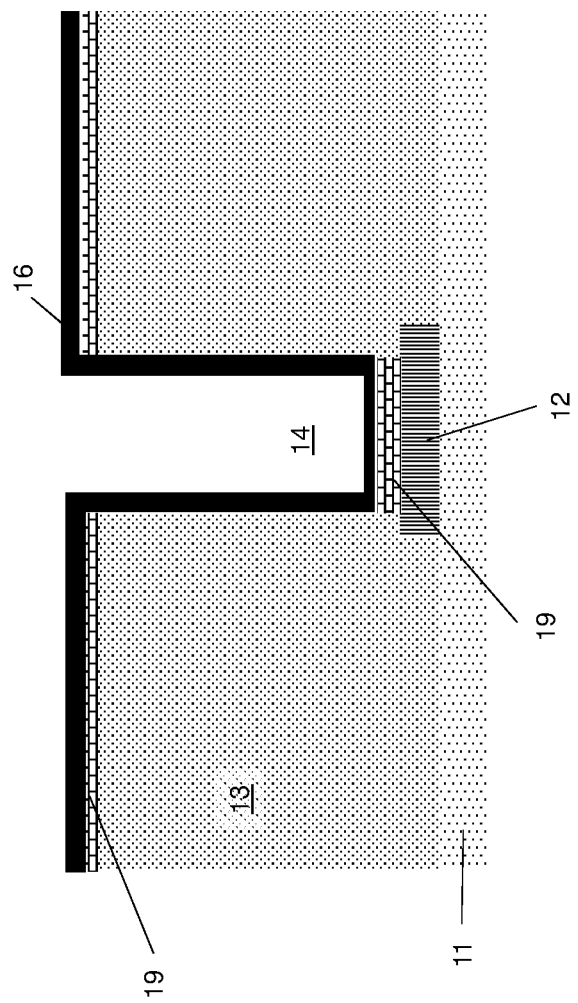
FIG. 3 illustrates a cross-sectional view of embodiments of a method for forming the conductive contact for a semiconductor shown in FIG. 1.

FIG. 3 shows deposition of titanium (Ti) liner 19 on conductive region 12. FIG. 3 also shows deposition of TiN barrier layer 16 on sidewalls of opening 14 and the titanium liner 19 on conductive region 12. Thin film deposition of titanium nitride includes chemical vapor deposition (CVD), physical vapor deposition (PVD) or atomic layer deposition (ALD). In embodiments, ALD is used to deposit the titanium nitride layer 16 in FIG. 3.

In embodiments, Ti liner 19 deposition is done by a PVD like process. The Ti liner deposition process includes a cleaning step using SiCONi ($NH_3/NF_3$ plasma). The cleaning step is followed by a 400° C. degas for about 1 minute to about 15 minutes using Argon gas or another noble gas. An about 5 nm RF to about 10 nm (radio frequency) Ti deposition with about 15% to about 90% ACT (automatic capacitance tuning) deposits the Ti layer. The temperature of the deposition is from about 200 to about 400 at a DC power of 0.5 to about 2 KW.

As a result, Ti liner is deposited on the top of conductive region 12. There is some deposition of titanium on dielectric 13 top surface and at the top corners of opening 14. However, this is removed in later processes described below. The titanium deposition results in very little, if any, Ti liner at the sidewalls of opening 14. At the surface of conductive region 12, the Ti reacts to form a silicide after a subsequent thermal treatment; however, there may still be some unreacted Ti at the surface of conductive region 12.

In embodiments, Ti deposition can be performed in a CVD process. This results in Ti deposition on all exposed surfaces including the sidewalls of opening 14. The deposition of Ti on the sidewalls is not important as it acts as a liner with the TiN.

TiN barrier layer 16 prevents subsequently deposited W or Co from migrating to unwanted area of the semiconductor device 10 (FIG. 1). TiN barrier layer acts as a glue layer between the dielectric 13 and the W or Co.

Unless otherwise stated, a deposition process can include any now known or later developed techniques appropriate including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In embodiments, the formation of a TiN liner can be by CVD or ALD using an organo-metallic precursor such as Tetrakis(dimethylamino)titanium (TDMAT), which can include multiple cycles of flowing the precursor onto a heated wafer (at about 300° C. to about 400° C.) and an $H_2$/Ar plasma treatment. Precursor flow duration varies from about 1 second to 10 seconds and plasma treatment time varies from about 1 second to 30 seconds. The sequence is repeated until the desirable TiN thickness is attained.

In embodiments, the formation of the TiN liner can be by ALD using a $TiCl_4NH3$ chemistry, which includes multiple steps of pulse flowing $TiCl_4$ to a wafer heated to about 300° C. to about 400° C., followed by pulse flowing $NH_3$. The pulse duration of $TiCl_4$ and $NH_3$ range from about 1 second to 10 seconds. The sequence repeats until the desirable TiN thickness is attained.

In embodiments, the formation of the TiN liner can be by ALD of Ti, follow by nitridation of the Ti to TiN. Ti deposition can be carried out with pulse flowing (1 second to 10 seconds) of $TiCl_4$ to a heated wafer (300° C. to 550° C.), followed by $H_2$ plasma (1 second to 30 seconds), and then pulsing $NH_3$ (1 second to 10 seconds). The sequence repeats to build up the desirable TiN thickness.

Figure 4:
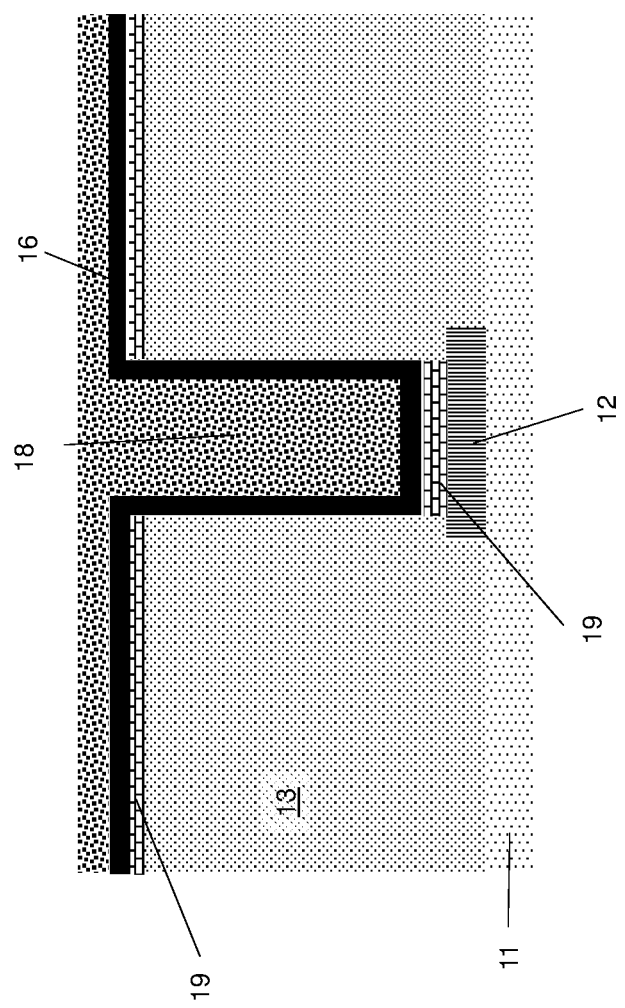
FIG. 4 illustrates a cross-sectional view of embodiments of a method for forming the conductive contact for a semiconductor shown in FIG. 1.

Opening 14 in FIG. 3 is then filled with a spacer material 18 as is shown in FIG. 4. Spacer material 18 is any material that is easily ashed away using heat and oxygen plasma or heat and $H_2N_2$ mixture (forming gas) plasma. The spacer material is applied by any known deposition technique described above. Spacer material leaves little or no residue when it is ashed. Spacer material is typically an organic material such as polymeric photo-resist, polymeric organic dielectric layers commonly referred to in the semiconductor industry as ODL102, ODL401, HM8006, etc., or carbon-based materials such as carbon nanoparticles or powder that can be spun onto the semiconductor device.

Figure 5:
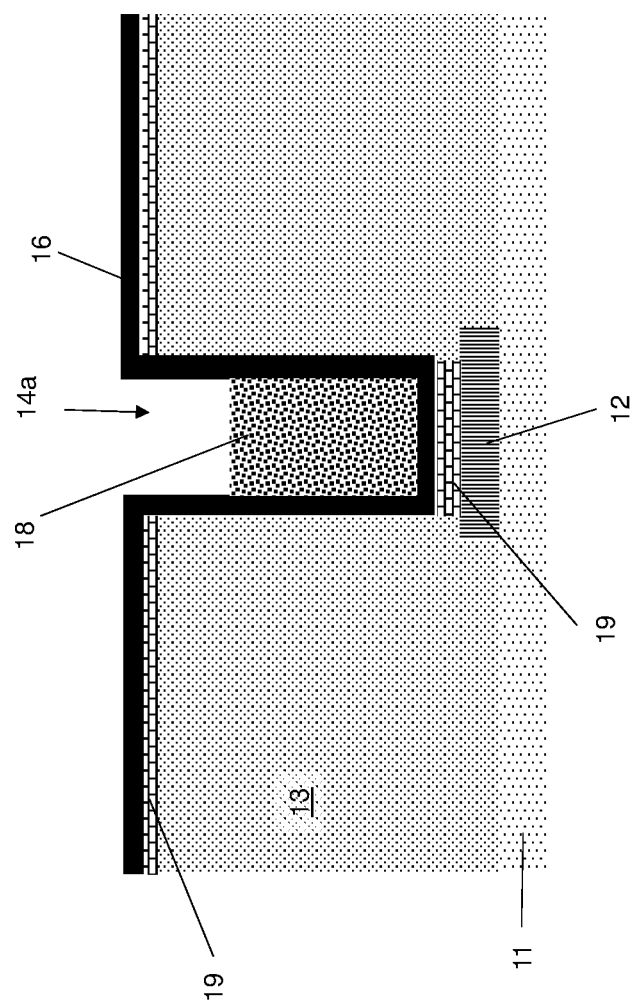
FIG. 5 illustrates a cross-sectional view of embodiments of a method for forming the conductive contact for a semiconductor shown in FIG. 1.

A partial removal of spacer material 18 is performed through heat and oxygen plasma or heat and $H_2N_2$ mixture plasma or other plasma processes, all referred to herein as ashing. Other methods for removal include a wet etch with sulfuric peroxide mixtures (SPM). However, wet etch methods are not as well controlled as ashing. In embodiments, the ashing is done in a vacuum condition using plasma. The spacer material removed partially reforms opening 14. In FIG. 5, the partially reformed opening is referred as opening 14a. Opening 14a extends from an upper surface of dielectric material 13 to an upper surface of unashed portion of spacer material 18.

Figure 6:
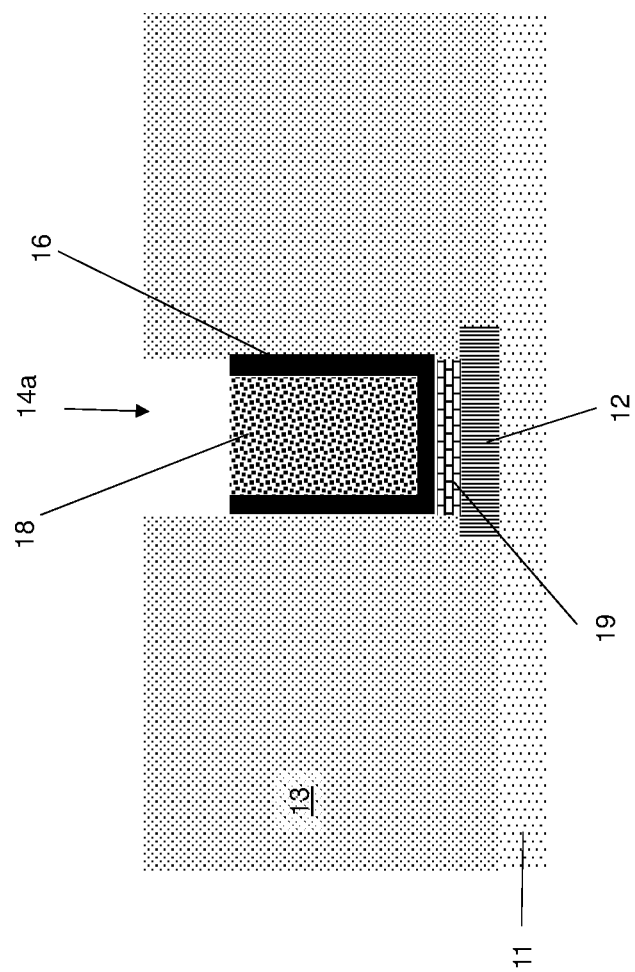
FIG. 6 illustrates a cross-sectional view of embodiments of a method for forming the conductive contact for a semiconductor shown in FIG. 1.

In FIG. 6 an etching process is performed to remove TiN barrier layer 16 above unashed portion of spacer material 18 and any TiN on the upper surface of dielectric material 13. The etching process also removes any Ti that may be on the corners or sidewalls of opening 14 above the remaining spacer material 18. This etch may widen opening 14a. In embodiments, a wet etch may be used that does not remove any additional spacer material 18.

Figure 7:
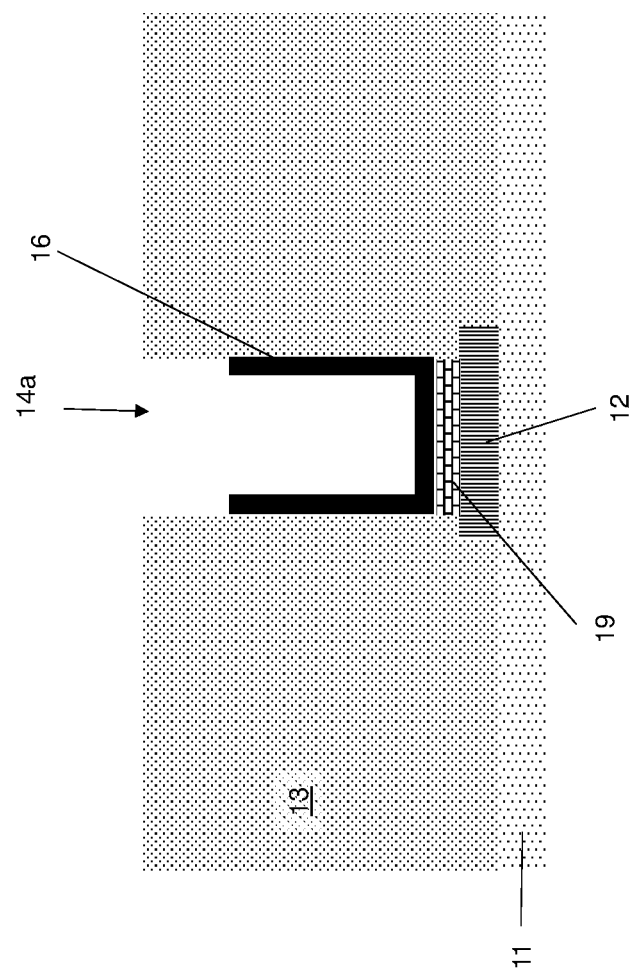
FIG. 7 illustrates a cross-sectional view of embodiments of a method for forming the conductive contact for a semiconductor shown in FIG. 1.

A second ash step is then performed to remove the remaining spacer material 18. This process is shown in FIG. 7. The ashing is performed through heat and oxygen plasma or heat and $H_2N_2$ mixture plasma without oxygen. The absence of oxygen prevents oxidation of exposed surfaces. The embodiment shown and described above is one method of producing the structure shown in FIG. 7. Other methods for producing the structure in FIG. 7 are available or may be developed in the future. All such methods are included in the disclosure herein.

Figure 8:
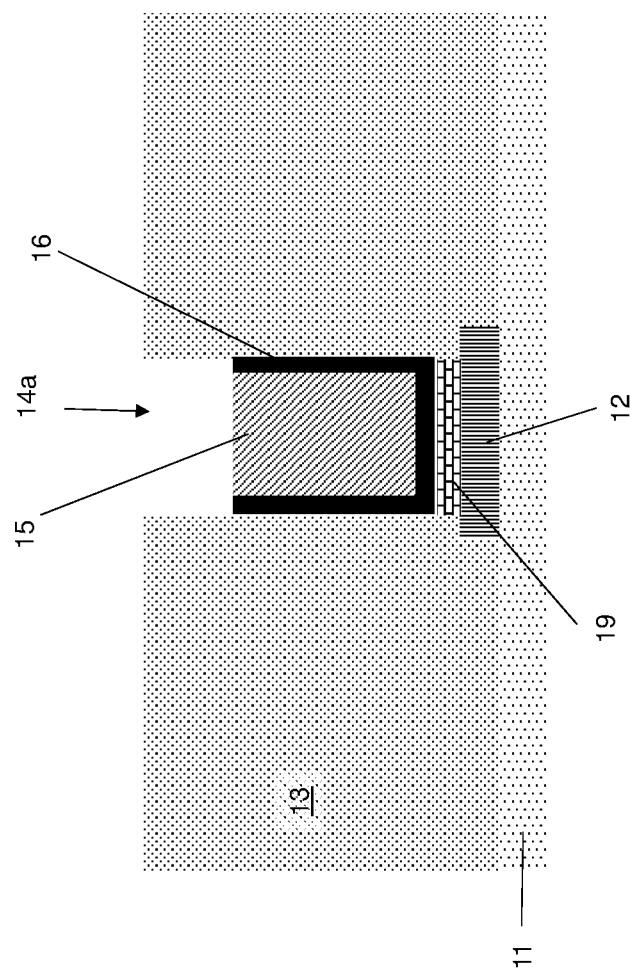
FIG. 8 illustrates a cross-sectional view of embodiments of a method for forming the conductive contact for a semiconductor shown in FIG. 1.

In FIG. 8, deposition of cobalt is performed. In an embodiment, cobalt material 15 is deposited by a selective CVD process. In such a process, precursors are used such that the Co will only deposit on a metal surface and not on the dielectric surface. Selective Co deposition is well known by those skilled in the art. Typical processes involve some pre-treatment of the metal surface, such as with hydrogen plasma or argon, followed by introducing a cobalt containing precursor such as cobalt carbonyl of which cobalt is deposited preferentially onto the metal.

Figure 9:
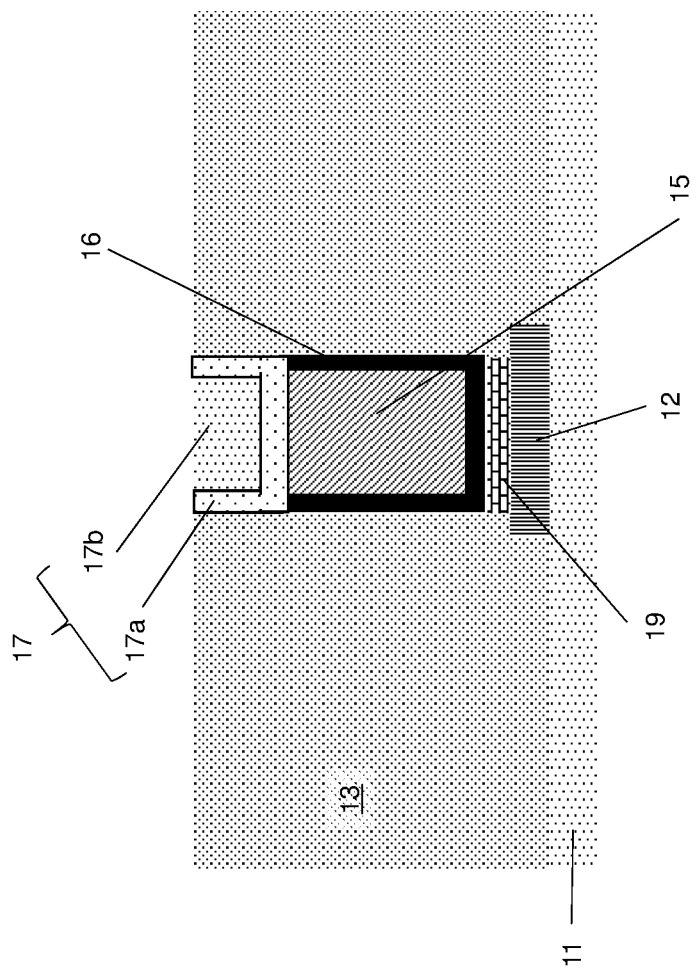
FIG. 9 illustrates a cross-sectional view of embodiments of a method for forming the conductive contact for a semiconductor shown in FIG. 1.

In FIG. 9, deposition of tungsten is performed. In an embodiment, tungsten-containing layer 17a is deposited by exposing opening 14a to a fluorine-free tungsten-containing organometallic precursor and a reduction agent. Reactants such as tungsten carbonyl, tungsten halides, or tungsten organometallics thermally decompose on heated wafer surfaces to form tungsten which is then densified in a hydrogen containing plasma. Tungsten-containing layer 17a may act as a nucleation layer or, alternatively, may act as a glue layer onto which tungsten is subsequently deposited. Tungsten-containing layer 17a may be deposited by any appropriate method, including by simultaneously exposing opening 14a to the organometallic precursor and reducing agent in a chemical vapor deposition type process or by introducing alternating pulses of the organometallic precursor and reducing agent in an atomic layer deposition (ALD) or pulsed nucleation layer (PNL) type process. Reducing agents include but are not limited to hydrogen, ammonia, methane, ethane, ethylene, and silanes. In ALD type processes, the reducing agent may be activated (e.g., atomic hydrogen) or non-activated. Activated reducing agent species may be produced by direct or remote plasma generators, thermal crackers, etc. Ion-induced ALD (iALD) may also be used. The deposited tungsten-containing layer 17a is generally a tungsten rich film. Acceptable compositions typically include tungsten (W), tungsten carbide (WC), tungsten carbo-nitride (WCN), tungsten nitride (WN), and combinations thereof.

The organometallic tungsten precursor is a halogen-free compound that may contain oxygen and nitrogen. Some examples of such compounds include but are not limited to tungsten hexacarbonyl, ethylcyclopentadienyl dicarbonyl nitrosyl tungsten, ethylcyclopentadienyl dihydrogen tricarbonyl, bis(tert-butylimino) bis(dimethylamino) tungsten. According to various embodiments, the precursor may be aliphatic or aryl, including any of alkyl, alkenyl, alkynyl and phenyl groups. The precursor may also have carbon and/or nitrogen, e.g., in the form of carbonyl, nitrosyl and amino groups.

In certain embodiments, the organometallic tungsten precursor may be introduced with a co-reactant, e.g., a carbon or nitrogen containing compound, to tune the composition of the deposited film. Also, in certain embodiments, non-organic compounds such as $W(CO)_6$, as well as organic derivatives of $W(CO)_6$ may be used. Importantly, the precursor used does not have a halogen (such as fluorine).

Tungsten-rich organometallic films (including W/WC films) have been shown to be continuous and have good adhesion at thicknesses between about 10-50 angstroms.

FIG. 9 depicts the formation of tungsten fill 17b, in accordance with an illustrative embodiment. Tungsten fill 17b is comprised of tungsten and may be formed using traditional $WF_6$ reduction. Tungsten fill 17b is formed from the bottom up. After forming contact tungsten plug 17 subsequent processing operations are performed, e.g., chemical mechanical planarization (CMP), etchback, or patterning.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar.

Figure 10:
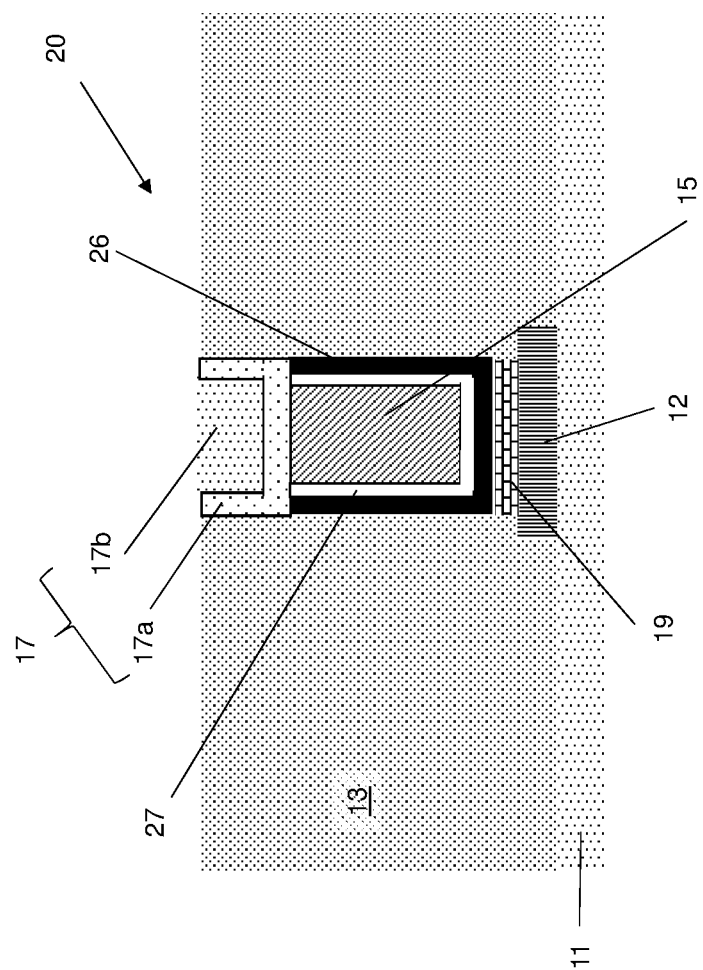
FIG. 10 illustrates a cross-sectional view of another embodiment of a conductive contact for a semiconductor device.

FIG. 10 shows a semiconductor device 20 having substrate layer 11 with conductive region 12 over substrate layer 11. Dielectric layer 13 is over substrate layer 11 and conductive region 12. Conductive region 12 can be a source or drain region in a FET. Cobalt contact 15 is electrically coupled to conductive region 12. In an embodiment shown in FIG. 10, cobalt contact is surrounded by a barrier layer composed of a titanium nitride layer 26 and on top of titanium nitride layer 26 there is a thin titanium layer 27. At the surface of the conductive region 12 there is a titanium liner 19. Above cobalt contact 15 is a tungsten cap 17. The tungsten cap 17 is formed in a two stage process, the first step being deposition of tungsten containing layer 17a followed by deposition tungsten 17b. In tungsten cap 17 is and there is no chemical difference between 17a and 17b.

Figure 11:
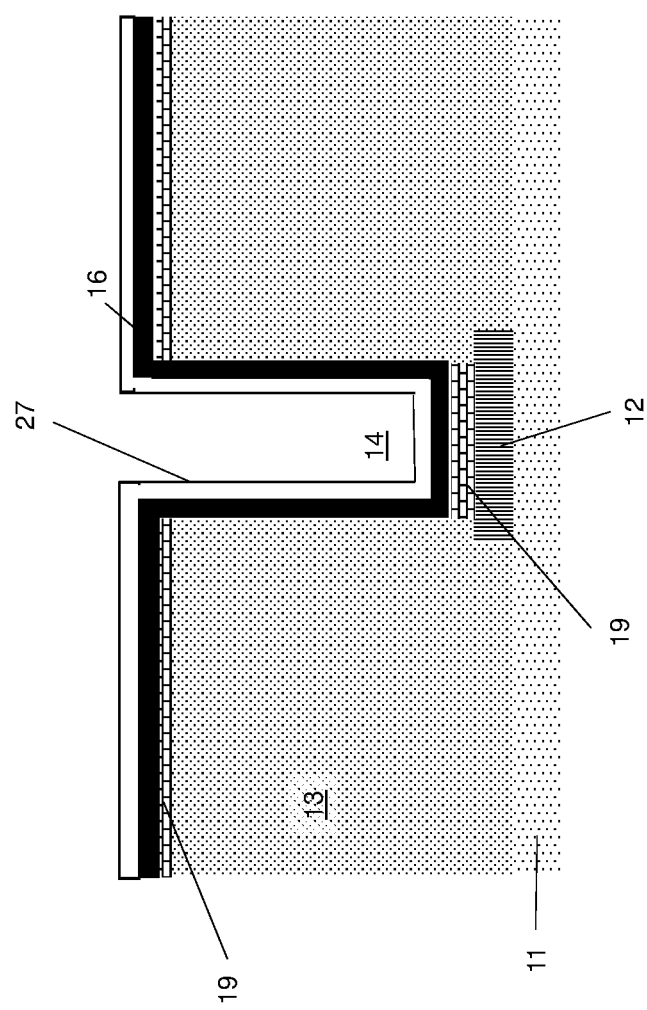
FIG. 11 illustrates a cross-sectional view of embodiments of a method for forming the conductive contact for a semiconductor shown in FIG. 10.

The method of manufacturing the semiconductor device of FIG. 10 is similar to the process to make the semiconductor device in FIG. 1. However, after forming the opening as shown in FIG. 2, there is deposition of a titanium liner 19 on the conductive region 12 as described above. FIG. 11 shows deposition of a barrier layer on the sidewalls of opening 14 and titanium liner 19, the deposition may be performed through ALD. Then, the last few cycles the process deposits a titanium layer 27. As shown in FIG. 11, a thin coating of titanium nitride (TiN) 26 is deposited on the sidewalls of opening 14 and then a thin coating of titanium 27 is deposited on the titanium nitride layer through atomic layer deposition (ALD).

The process for depositing the dual barrier layer is as follows: during ALD TiN deposition, for the last few cycles, deposition of layer containing almost pure titanium is performed. During the TiN deposition the following example chemical reaction can occur:

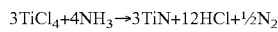

$3TiCl_4 + 4NH_3 \rightarrow 3TiN + 12HCl + \frac{1}{2}N_2$

However, titanium nitride in other Ti:N ratios can also be formed. This is followed by deposition of Ti using the reaction:

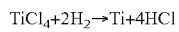

$TiCl_4 + 2H_2 \rightarrow Ti + 4HCl$

The processes described in FIGS. 4-9 are then performed resulting in the device shown in FIG. 10.

Figure 12:
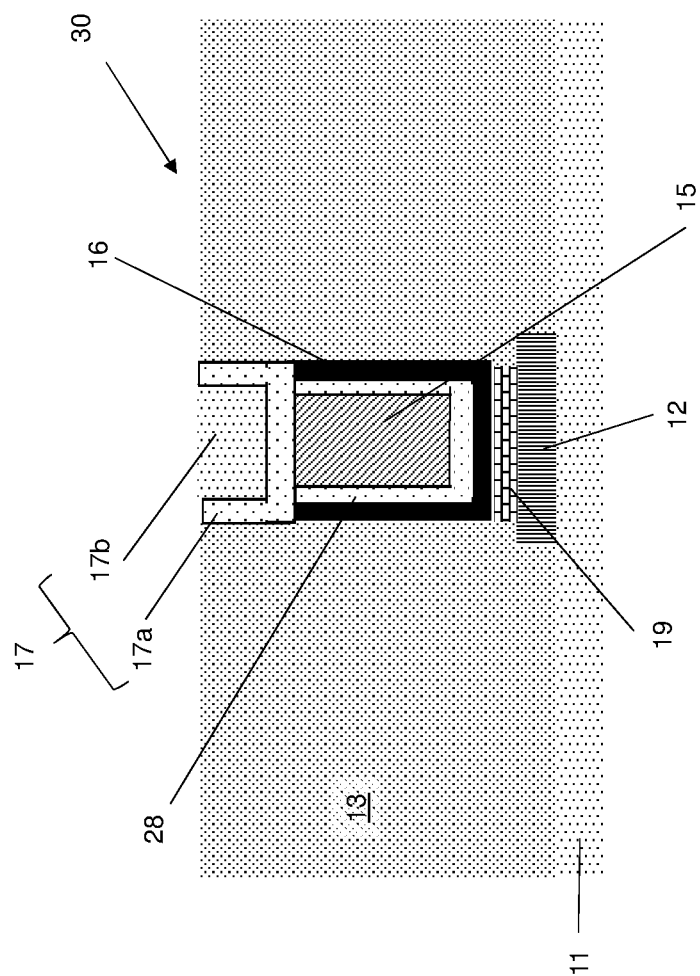
FIG. 12 illustrates a cross-sectional view of another embodiment of a conductive contact for a semiconductor device.

FIG. 12 shows a semiconductor device 30 having a substrate layer 11 and conductive region 12 over substrate layer 11. A dielectric layer 13 is over substrate layer 11 and conductive region 12. The conductive region can be a source or drain region in a FET. A cobalt contact 15 is electrically coupled to conductive region 12. In the embodiment shown in FIG. 12, cobalt contact is surrounded by a tungsten layer 28 deposited on a titanium nitride barrier layer 16. At the surface of conductive region 12 there is a titanium liner 19. Above cobalt contact 15 is a tungsten cap 17. The tungsten 17 cap is formed in a two stage process, the first step being deposition of tungsten layer 17a followed by deposition tungsten 17b. In tungsten cap 17 is and there is no chemical difference between 17a and 17b.

Figure 13:
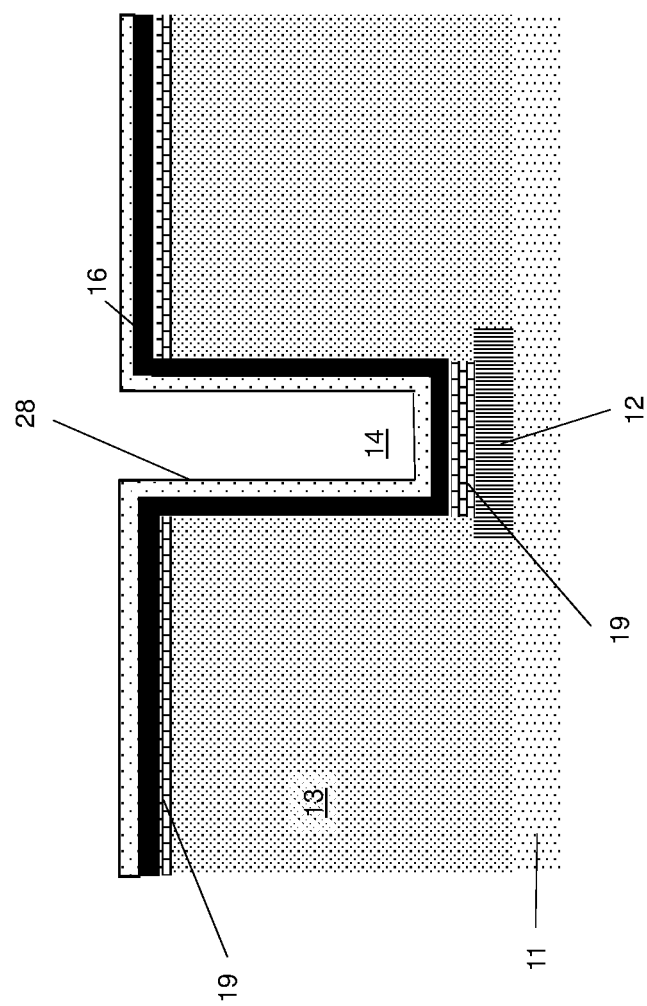
FIG. 13 illustrates a cross-sectional view of embodiments of a method for forming the conductive contact for a semiconductor shown in FIG. 12.

The method of manufacturing the device is similar to method described above for manufacturing the semiconductor device of FIG. 1. There is deposition of titanium liner 19 on conductive region 12 as described above in FIG. 3. After deposition of the titanium nitride layer 16 in FIG. 3, a fluorine free tungsten deposition is performed resulting in a tungsten layer 28 on the titanium nitride layer 16. This provides increased adhesion of the cobalt in the subsequent deposition. This process is shown in FIG. 13. The processes described in FIGS. 4-9 are then performed resulting tin the device shown in FIG. 12.

Figure 14:
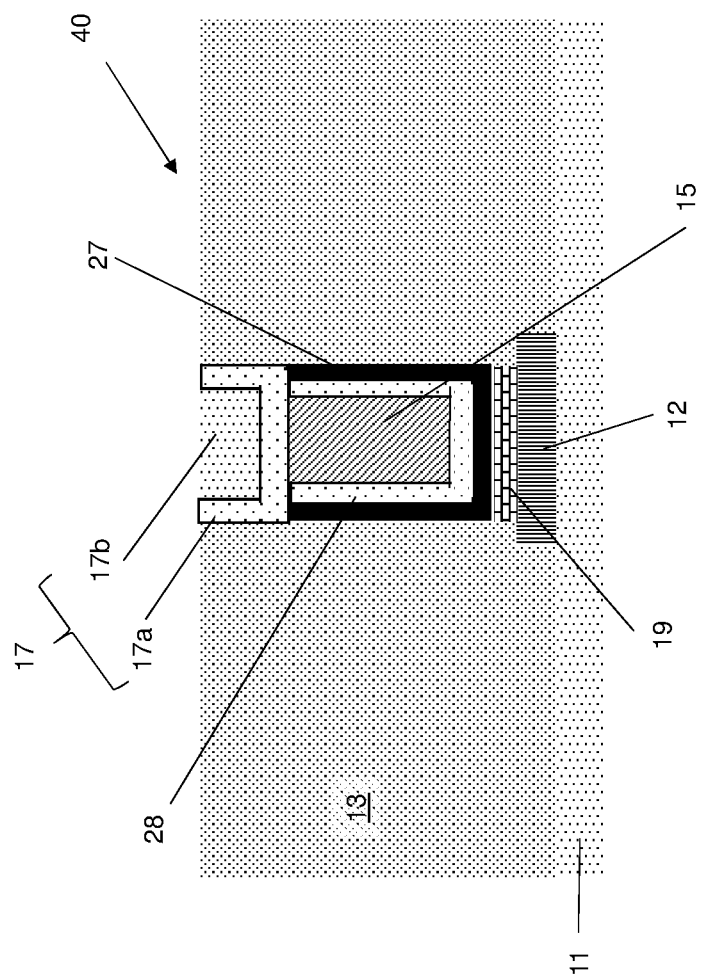
FIG. 14 illustrates a cross-sectional view of another embodiment of a conductive contact for a semiconductor device.

FIG. 14 shows a semiconductor device 40 having a substrate layer 11 and conductive region 12 over substrate layer 11. A dielectric layer 13 is over substrate layer 11 and conductive region 12. There is deposition of a titanium liner 19 on conductive region 12 as described above in FIG. 3. The conductive region can be a source or drain region in a FET. A cobalt contact 15 is electrically coupled to conductive region 12. In an embodiment shown in FIG. 14, cobalt contact is surrounded by a fluorine free tungsten layer 28 deposited on a titanium layer 27. Above cobalt contact 15 is a tungsten cap 17. The tungsten 17 cap is formed in a two stage process, the first step being deposition of tungsten layer 17a followed by deposition tungsten 17b.

Figure 15:
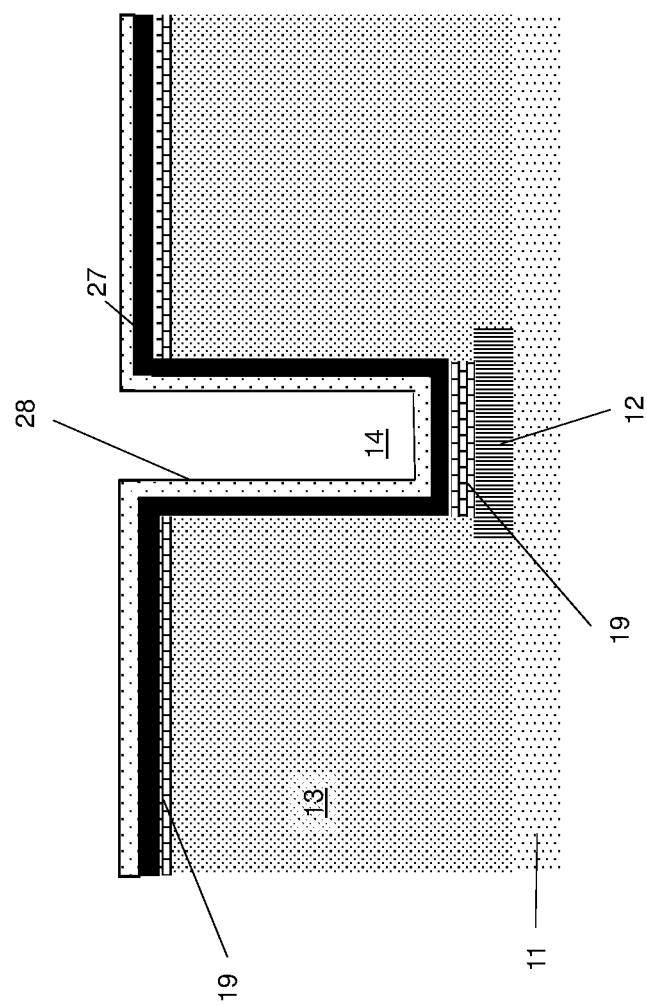
FIG. 15 illustrates a cross-sectional view of embodiments of a method for forming the conductive contact for a semiconductor shown in FIG. 14.

The method of manufacturing the device in FIG. 14 is similar to method described above for manufacturing the semiconductor device of FIG. 10. After forming the opening as shown in FIG. 2, there is a deposition of titanium liner 19 on conductive region 12 as described above. There is then a deposition of titanium layer 27 rather than a titanium nitride layer followed by a fluorine free tungsten deposition resulting in a tungsten layer 28 on titanium layer 27. Tungsten layer 28 increases adhesion of cobalt contact 15 and encapsulates the cobalt to prevent migration. This is shown in FIG. 15. The processes described in FIGS. 4-9 are then performed resulting tin the device shown in FIG. 14.

In embodiments, for FIGS. 1, 10, 12 and 14 the cobalt plug or contact 15 has a height of from about 50 nm to about 150 nm. The length of the cobalt plug is from about 15 nm to about 500 nm. The width of the tungsten contact or plug is from about 10 to about 35 nm.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method for forming a contact on a semiconductor device, the semiconductor device including a conductive region disposed over a substrate, the method comprising:
   depositing a dielectric material on the substrate;
   forming an opening in the dielectric material to expose the conductive region;
   siliciding a surface of the exposed conductive region by depositing titanium on the exposed conductive region;
   depositing a barrier layer on sidewalls and the titanium of the opening;
   depositing a spacer material in the opening having the barrier layer;
   ashing a portion of the spacer material to form an upper opening that extends downward from an upper surface of the dielectric material to an upper surface of an unashed portion of the spacer material;
   removing the barrier layer in the opening to expose the sidewalls above the unashed portion of the spacer material, and
   ashing the unashed portion of the spacer material from a lower portion of the opening;
   depositing cobalt in the lower portion of the opening, the cobalt terminating at an upper surface of the barrier layer;
   depositing tungsten to fill the opening to at least the upper surface of the dielectric material; and
   planarizing the upper surface of the dielectric material with the tungsten in the opening.

2. The method of claim 1, wherein the depositing tungsten to fill the opening comprises:
   depositing a fluorine-free tungsten layer in the opening; and depositing a tungsten fill on the fluorine-free tungsten layer to fill the opening.

3. The method of claim 1, wherein the barrier layer comprises titanium nitride.

4. The method of claim 1, wherein the barrier layer comprises a dual layer of titanium deposited on titanium nitride.

5. The method of claim 1, wherein the spacer material comprises one of a polymeric photo-resist, a polymeric organic dielectric layer, or a carbon-based material.

6. A method for forming a contact on a semiconductor device, the semiconductor device including a conductive region disposed over a substrate, the method comprising:
   depositing a dielectric material on the substrate;
   forming an opening in the dielectric material to expose the conductive region;
   siliciding a surface of the exposed conductive region by depositing titanium on the exposed conductive region;
   depositing a barrier layer on sidewalls and the titanium of the opening;
   depositing a spacer material in the opening having the barrier layer;
   ashing a portion of the spacer material to form an upper opening that extends downward from an upper surface of the dielectric material to an upper surface of an unashed portion of the spacer material;
   removing the barrier layer in the opening to expose the sidewalls above the unashed portion of the spacer material;
   ashing the unashed portion of the spacer material from a lower portion of the opening;
   depositing cobalt in the lower portion of the opening, the cobalt terminating at an upper surface of the barrier layer;
   depositing a first tungsten layer on the deposited cobalt and on sidewalls of the dielectric material, wherein the first tungsten layer includes a cavity having a lower surface positioned vertically between the cobalt and the upper surface of the dielectric material;
   depositing a second tungsten layer to fill the cavity to at least the upper surface of the dielectric material; and
   planarizing the upper surface of the dielectric material with the first and second tungsten layers within the opening.

7. The method of claim 6, wherein an upper surface of the first tungsten material is substantially coplanar with the upper surface of the dielectric layer and an upper surface of the second tungsten layer within the opening, after the planarizing.

8. The method of claim 6, wherein the first tungsten layer comprises a tungsten-rich film, and wherein the second tungsten layer comprises a tungsten fill region within the tungsten-rich film.

9. The method of claim 6, wherein the barrier layer comprises a dual layer of titanium deposited on titanium nitride.

10. The method of claim 6, wherein the spacer material comprises one of a polymeric photo-resist, a polymeric organic dielectric layer, or a carbon-based material.

11. The method of claim 6, further comprising depositing a fluorine-free tungsten layer in the opening the sidewalls of the opening, before depositing the first and second tungsten layers.

* * * * *